(12) United States Patent
Brod et al.

(10) Patent No.: US 7,828,217 B2
(45) Date of Patent: Nov. 9, 2010

(54) METHOD AND DEVICE FOR PRODUCING RFID SMART LABELS OR SMART LABEL INLAYS

(75) Inventors: Volker Brod, Bad Abbach (DE); Ralf Wolfgang God, Dresden (DE); Gerald Niklas, Zell-Beucherling (DE); Stefan Wilhelm, Königsbrück (DE)

(73) Assignee: Muhlbauer AG (DE)

( * ) Notice: Subject to any disclaimer, the term of this patent is extended or adjusted under 35 U.S.C. 154(b) by 968 days.

(21) Appl. No.: 11/390,432

(22) Filed: Mar. 27, 2006

(65) Prior Publication Data

US 2007/0221738 A1    Sep. 27, 2007

(51) Int. Cl.
*G06K 7/10* (2006.01)

(52) U.S. Cl. .............. 235/472.02; 235/380; 235/492

(58) Field of Classification Search ............ 235/375, 235/380, 492, 487, 472.02
See application file for complete search history.

(56) References Cited

U.S. PATENT DOCUMENTS

| | | | |
|---|---|---|---|
| 2003/0136503 A1 | 7/2003 | Green et al. | 156/264 |
| 2004/0125040 A1 | 7/2004 | Ferguson | 343/895 |
| 2004/0154161 A1 | 8/2004 | Aoyama et al. | 29/739 |
| 2004/0238098 A1* | 12/2004 | Bleckmann et al. | 156/73.1 |
| 2005/0168339 A1* | 8/2005 | Arai et al. | 340/572.8 |

FOREIGN PATENT DOCUMENTS

DE    103 58 422 B3    4/2005

\* cited by examiner

*Primary Examiner*—Karl D. Frech
(74) *Attorney, Agent, or Firm*—Ballard Spahr LLP

(57) ABSTRACT

The invention concerns a method and a system for production of RFID smart labels or smart label inlays, in which a multiplicity or RFID straps (11) are connected in succession with a multiplicity of antennae (20), where in a first step the RFID straps (11) to be arranged on a strap substrate band (5*a*) are separated (8, 9) and mounted on a substrate band (1, 1*a*, 1*b*, 1*c*; 10, 10*a-c*) for the smart labels or smart label inlays to be produced, and in a subsequent second step the antennae (20) are mounted on the substrate band (1, 1*a*, 1*b*, 1*c*; 10, 10*a-c*) and on first connection surfaces (26) of the RFID straps (11) such that the connection surfaces (26) of each RFID strap (11) electrically contact second connection surfaces of the antennae (20) allocated to the RFID strap (11) or the first connection surfaces (26) are positioned for electrical contact and fixed on the second connection surfaces.

17 Claims, 6 Drawing Sheets

METHOD AND DEVICE FOR PRODUCING RFID SMART LABELS OR SMART LABEL INLAYS

Figure 1:
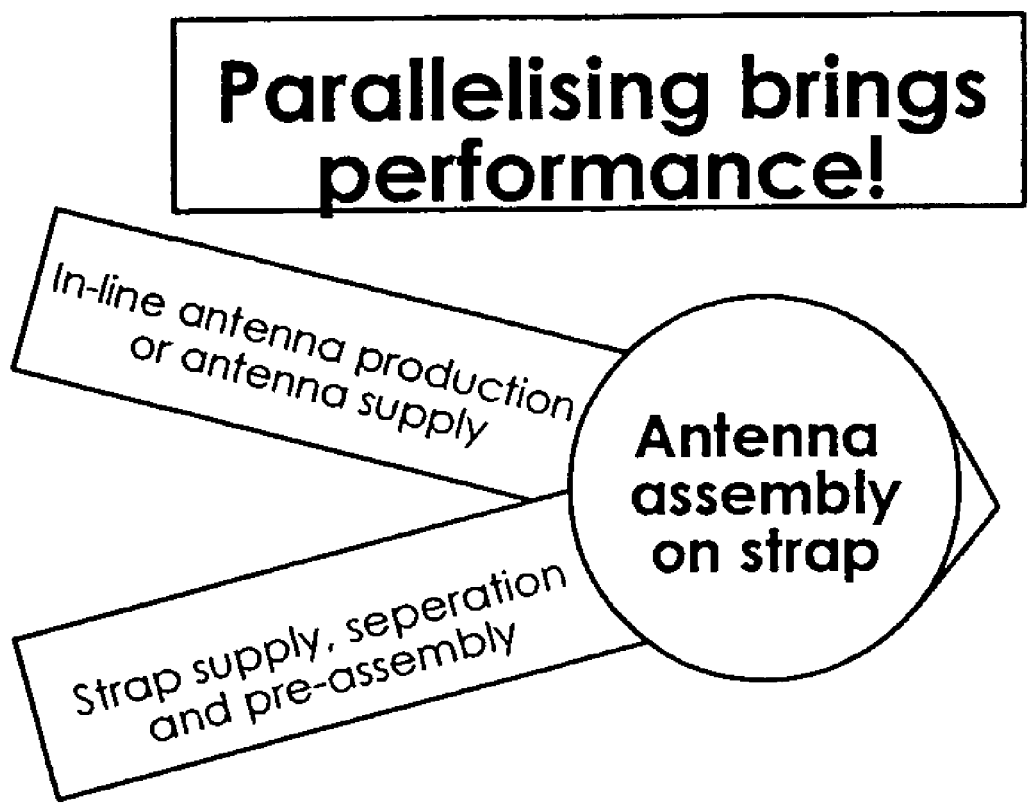

The invention concerns a method and a system for production of RFID smart labels or smart label inlays, in which a multiplicity of RFID straps are joined together in succession with a multiplicity of antennae in accordance with the preambles of claims 1 and 16.

For production of smart labels or RFID transponders, the RFID chips are often mounted directly on an antenna arranged on a web or band. Alternatively the RFID chips are mounted as chip modules, interposed or flip-chip bridges pre-assembled as straps, as a unit on the antennae which in turn are already arranged on webs. This is shown for example from US 2004/0194876 A1 in which a method is described for connecting chip modules with antennae arranged on webs, in which a carrier band fitted with antennae and a carrier band fitted with the chip modules are brought over each other. The chip modules are then detached from their carrier band by guiding the chip module carrier band around a sharp edge. The detached chip module and the following chip modules are mounted on the antenna carrier band at their allocated positions which correspond to the positions of the antennae on the further carrier band.

By assembling the straps each on the antennae arranged on the antenna carrier band, an RFID inlay or smart label inlay or RFID transponder inlay is produced. This RFID inlay is normally processed further with conversion machines into self-adhesive smart labels or RFID tickets etc.

The strap fitted with the RFID chip is made of various substrate materials. For this substrate materials are used on the basis of metal, polymer or paper. The actual connection surfaces of the RFID straps consist for example of silver conductor paste, electrically conductive inks, copper, aluminium etc. which are applied to strip-like polymer or paper material and constitute an electrically conductive material.

For production of an electrically conductive connection between the antennae and the straps applied to the antenna carrier band, various types of connection can be used such as for example a thermo-sensitive conductive adhesive, a solder process, laser welding or thermo-compression. Alternatively a crimp or clinch process can be used as a mechanical connection method.

Frequently RFID straps are produced such that on a strap substrate band of metal or polymer material, first electrically conductive enlarged connection surfaces are applied, on which the RFID chips are then arranged. The RFID chips are here deposited by means of the flip-chip method on the connection surfaces and electrically connected therewith. The resulting straps or chip modules with a total of two enlarged connection surfaces serve for easier contact finding with the connection surfaces of the antennae arranged on the antenna band during and after the strap transfer process.

Before the transfer of the RFID straps to the antenna band, the RFID straps are normally arranged in rows on a strap substrate band which is arranged in a roll form and applied over the antenna strap by unrolling of the substrate band. First the RFID straps are separated from the substrate band by means of a punch or cutting process, for individual assembly of the straps on the antennae and the antenna band. This leads to a temporal delay in the entire assembly sequence since such a separation step in comparison with the remaining process steps within such a system is more time-intensive, not least because of the resulting brief holding of the strap substrate band during the punching process.

Also with the positioning of said individual RFID straps on the antenna band, in particular with regard to the connection surfaces of the antennae to be arranged above each other and the RFID straps, the problem arises of the precise depositing of the straps on the antenna band with a continuously moving antenna band, which is the aim in view of the desirable high throughput of the entire system.

Consequently the present invention is based on the object of preparing a method and a system for production of RFID smart labels or RFID smart label inlays in which a high throughput of the entire production system can be achieved.

This object is achieved with relation to the method by the features of claim 1 and in relation to the system by the features of claim 16.

One essential point of the invention is that in a method for production of RFID smart labels or smart label inlays in which a multiplicity of RFID straps and a multiplicity of antennae are to be connected in succession, in a first step first the RFID straps to be arranged on the strap substrate band must be separated and mounted on a substrate band for the smart labels or smart label inlays to be produced, and then in a subsequent second step the antennae must be mounted on the substrate band and on first connection surfaces of the RFID straps such that the first connection surfaces of each RFID strap electrically contact the second connection surfaces of the antennae allocated to the RFID strap. Thus the straps are not allocated to an antenna band and the antennae arranged thereon, but the antennae are allocated to a substrate band on which the straps are first arranged. This means that the antennae with their connection surfaces are mounted on the RFID straps with their connection surfaces, which advantageously gives a temporal decoupling of the two procedures of antenna web supply and strap assembly. With automated production of a large number of RFID smart labels or RFID transponders, the maximum possible throughput of a production system was previously limited by the fact that the RFID straps first had to be separated during the in-line process, which led at least to discontinuous operation of the entire system. This means that even if the antennae were previously placed on the antenna band close together, the running speed of the antenna band previously used was determined by the separation process of the straps. In contrast now the strap assembly according to the first step of the process according to the invention is temporally independent of the antenna web supply according to the second step of the method of the invention, so that there is no mutual dependency and hence no time-limiting factors based on the separation step.

Advantageously the antennae can be produced in-line in an earlier process step in which for example they are applied to an antenna band to be supplied to the main substrate band, and temporally in parallel the straps are separated and applied to the main substrate band. This means that the production times per smart label or smart label inlay can be reduced and hence the entire production system has a higher throughput.

The antennae which have already been produced before supply to the main substrate band, were either made in-line i.e. continuously at the speed of their supply to the main substrate band, or can be supplied to the substrate band as finished antenna products at any supply speed.

The straps pre-mounted on the main substrate band before supply of the antennae have enlarged contact surfaces in relation to conventional RFID chips in order to make electrical contact with the connection surfaces of the antennae to be applied during deposition of the antennae. Then an electrically conductive connection takes place between the connection surfaces of the straps on one side and the antennae on the other. With such parallelising of in-line production of the antennae and strap pre-assembly on the substrate band, it is possible for both the antenna band to be supplied and the substrate band to be continuously advanced in order to achieve maximum possible throughput of the production system. Alternatively discontinuous operation is conceivable.

The RFID straps are mounted on the substrate band with pre-determined spacing that is synchronised with a proposed spacing of the antennae to be applied later. This can be influenced also by the running speed of the strap substrate band and/or the main substrate band.

The spacing is preferably synchronized by means of comparison of optical recording data of the RFID strap positions on the substrate band and data from the proposed positions of the antennae on the substrate band.

The substrate band as an auxiliary carrier substrate band is removed after assembly of the RFID straps and antennae from the resulting smart labels or smart label inlays. Alternatively the smart labels or smart label inlays can be punched out and removed from the substrate band as self-adhesive smart labels or smart label inlays.

On the top of the RFID strap before assembly of the strap an adhesive layer is applied which serves for fixing of the antennae to be mounted subsequently. For this the adhesive layer can be heated after or before strap assembly.

According to a preferred embodiment the RFID straps on their underside have an adhesive layer for fixing of the RFID strap to the substrate band, where this adhesive layer is applied to the substrate band before assembly. This can also be performed or supported alternatively or additionally by means of an adhesive layer spot-applied to the substrate band to fix the straps.

The substrate band can be formed self-adhesive along its entire surface so that the antennae can be laminated on to this self-adhesive substrate band under pressure without heat effect.

A system for production of the RFID smart label or smart label inlay by successive joining of a multiplicity of RFID straps with a multiplicity of antennae, viewed in the running direction of the substrate band, first has a device for application of the individual RFID strap and subsequently a device for supply and application of the antennae to the substrate band.

Further advantageous embodiments arise from the sub-claims.

Figure 2:
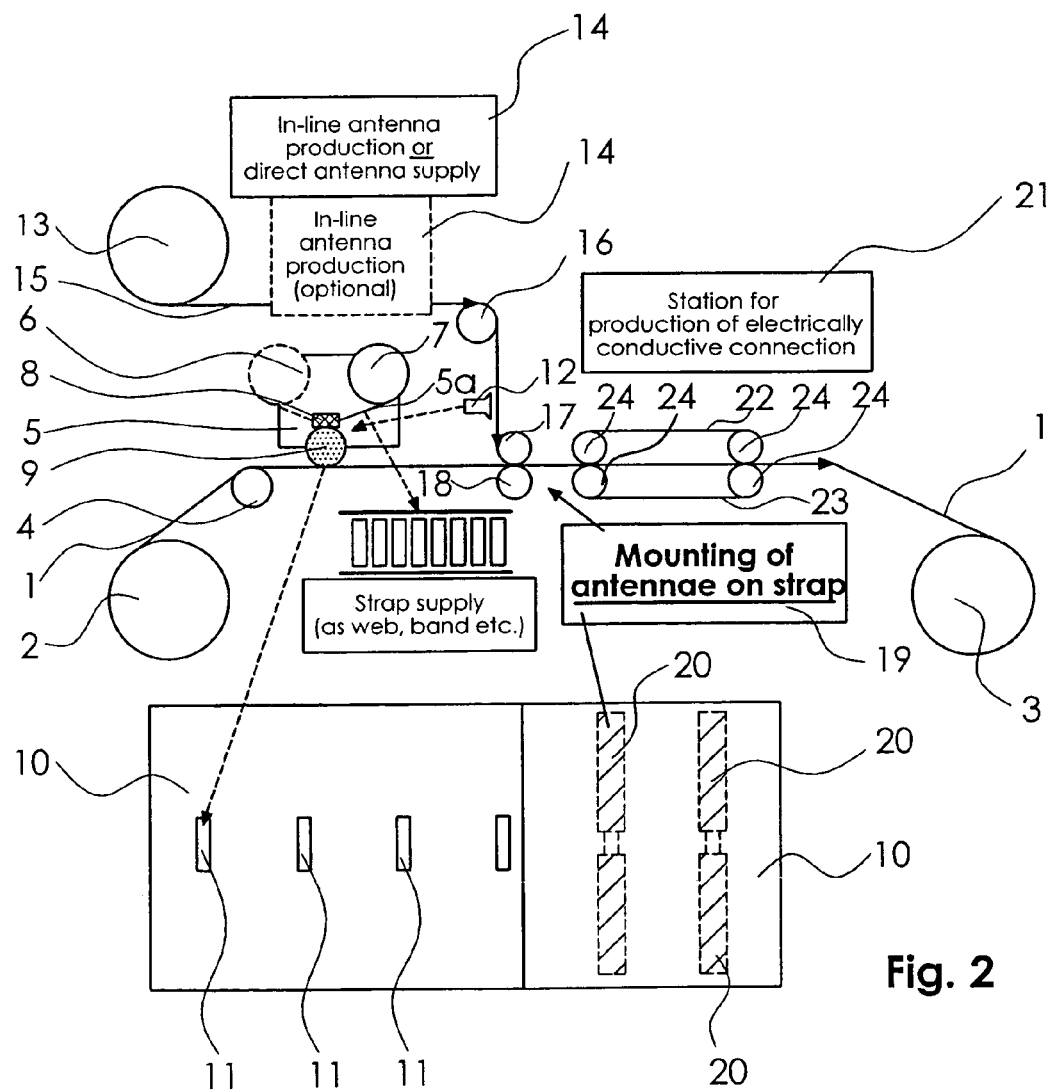
Figure 3:
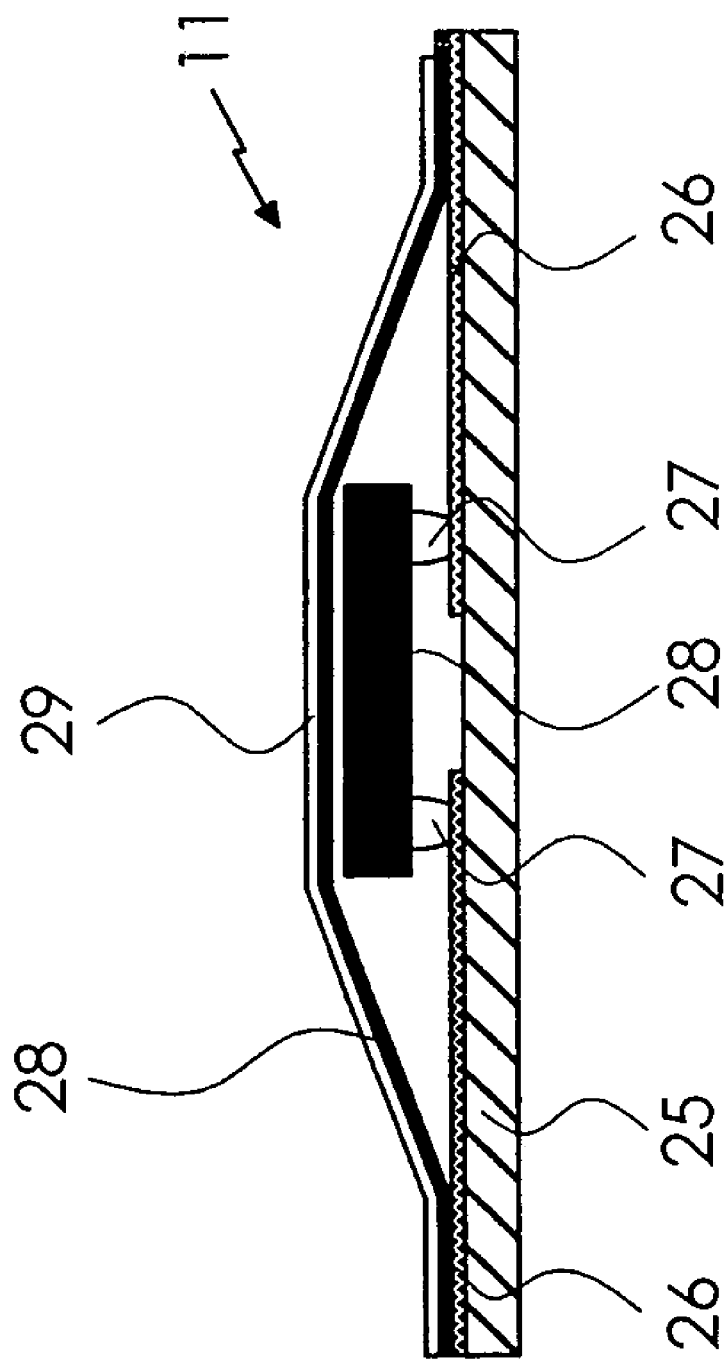
Figure 4:
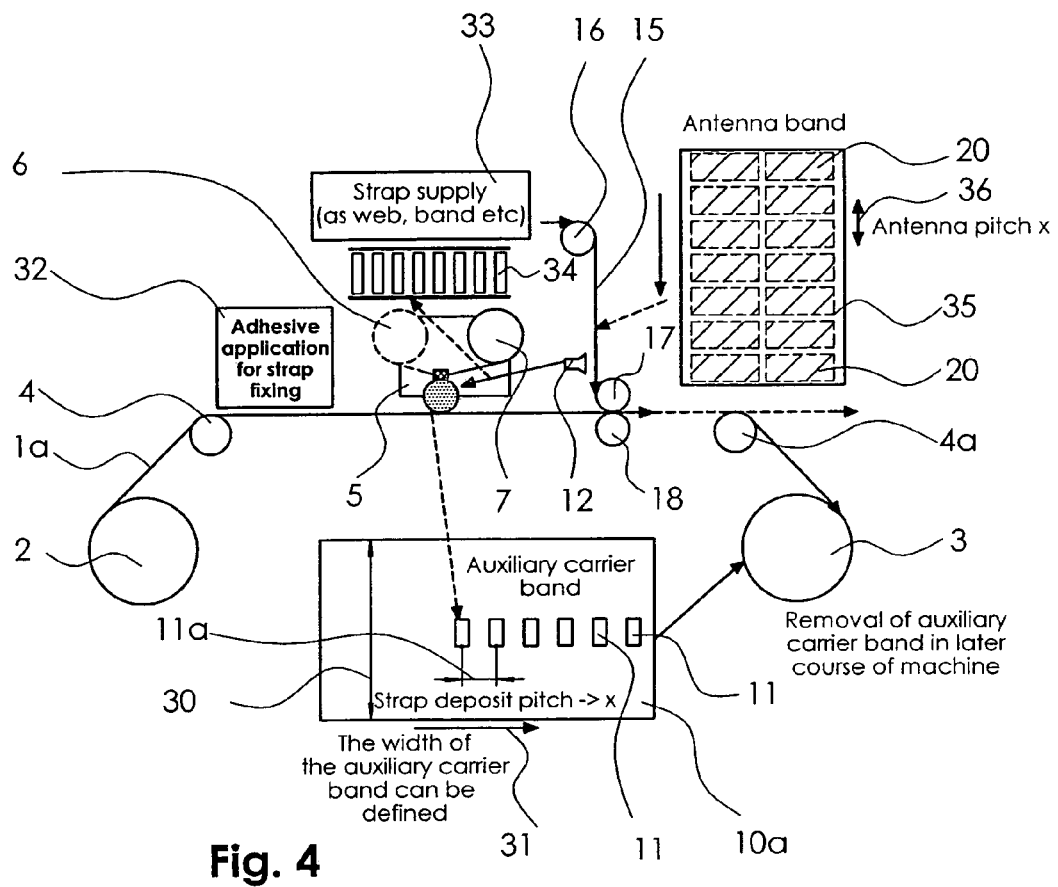
Figure 5:
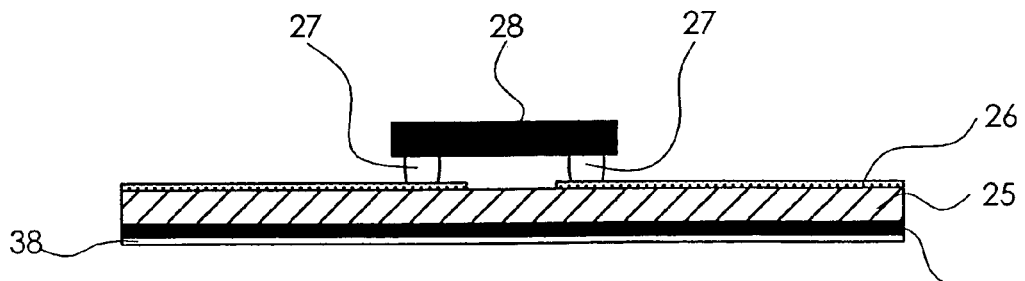
Figure 6:
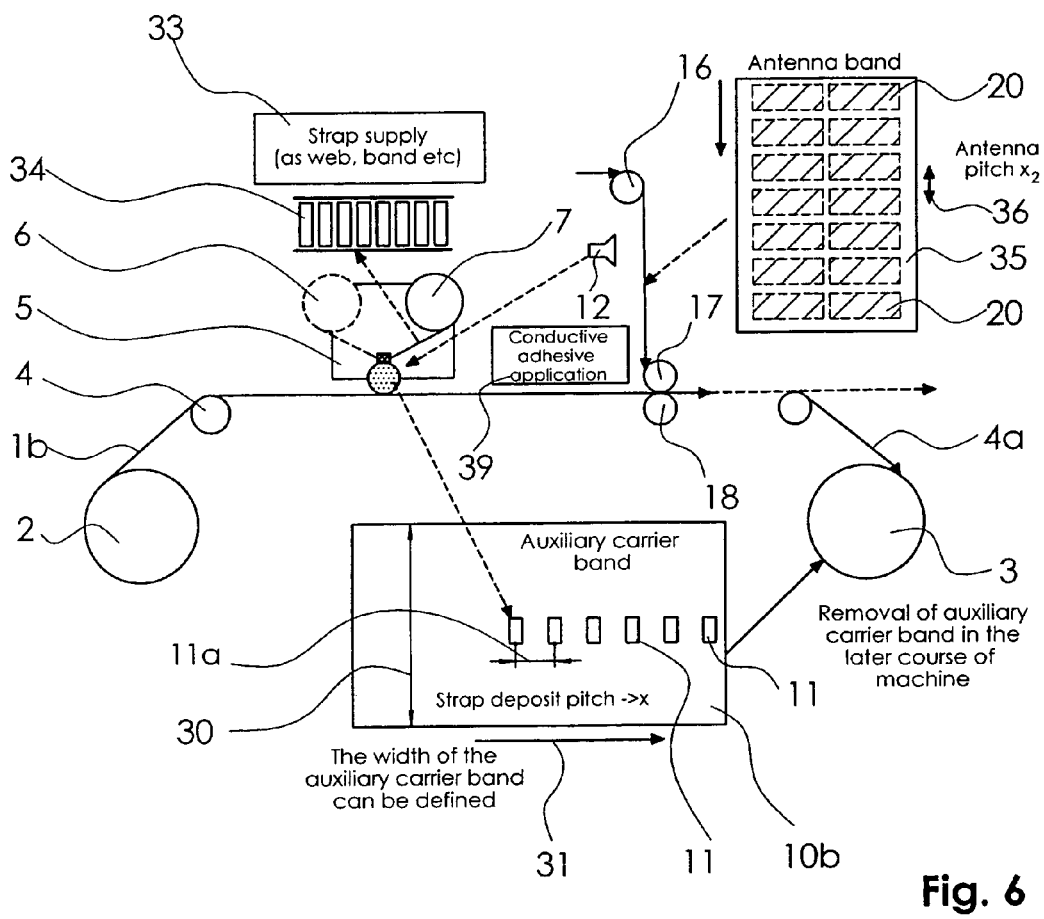
Figure 7:
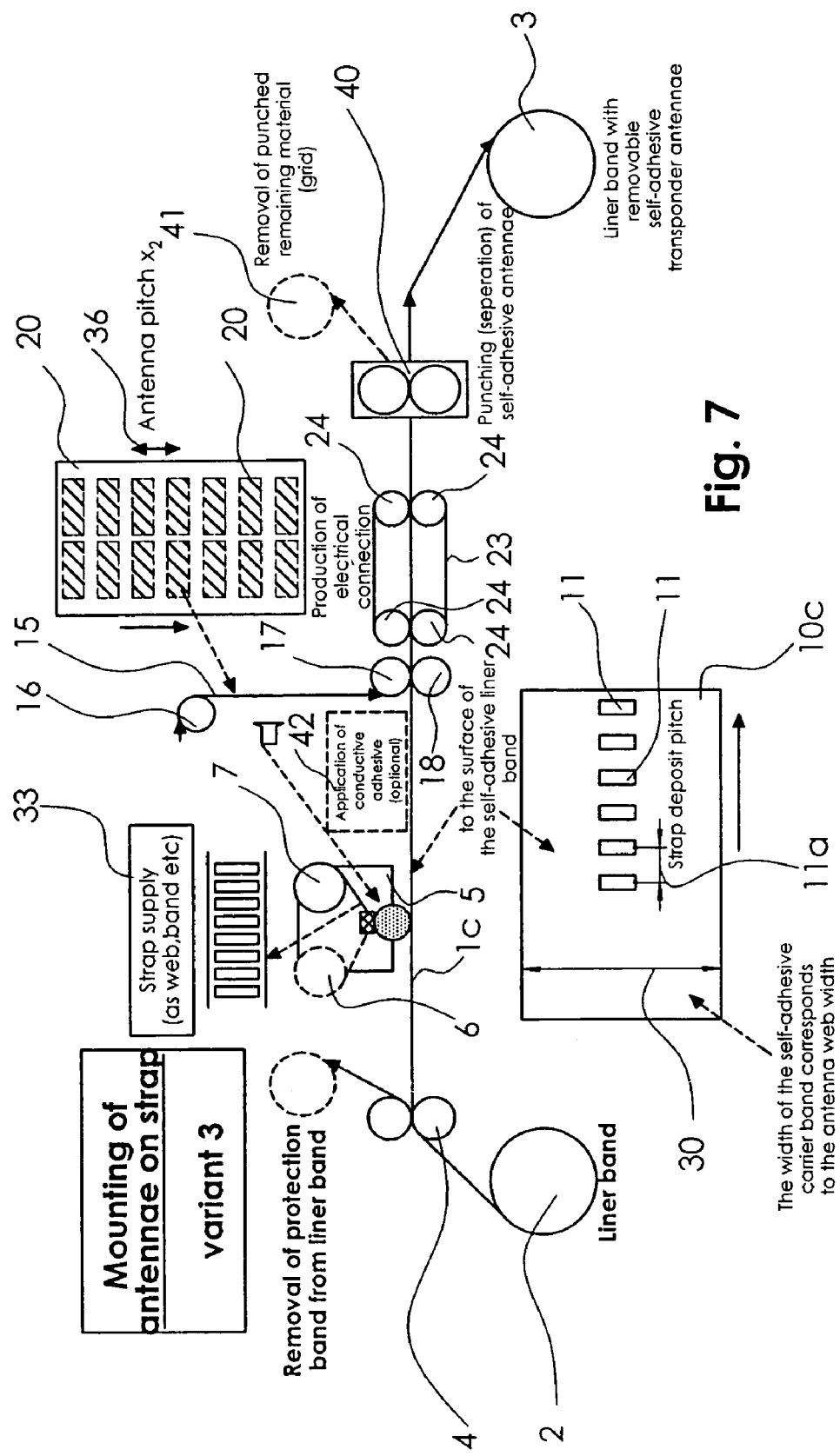

The advantages and applications of the invention are described below in conjunction with the drawings. These show:

FIG. 1: in a first diagrammatic view the basic principle of parallelising according to the method of the invention;

FIG. 2: in a diagrammatic view a production system for performance of the method according to the invention in a principle structure;

FIG. 3: in a diagrammatic side view the structure of a possible RFID strap for use in the method according to the invention;

FIG. 4: in a diagrammatic side view the structure of a system for performance of the method of the invention according to a first embodiment;

FIG. 5: in a diagrammatic side view a further structure of a RFID strap for its use in a system as shown in FIG. 6;

FIG. 6: in a diagrammatic side view a structure of a further system for performance of the method of the invention according to a second embodiment; and FIG. 7: in a diagrammatic side view the structure of a further system for performance of the method of the invention according to a third embodiment.

FIG. 1 shows the basic principle of parallelising according to the method according to the invention. Parallelising of the in-line antenna production or antenna supply to the main substrate and strap supply with separation and pre-assembly on the main substrate band, advantageously achieves time saving and the result is antenna mounting on the strap and not vice versa.

FIG. 2 shows in diagrammatic side view a system which constitutes the basic principle of the method according to the invention. A main substrate band 1 is unwound from a roll 2 and wound onto a roll 3. The substrate band is deflected via a roller 4.

The system has a device for separation and application of an RFID strap. This device 5 comprises a strap substrate band 5a which is deflected about deflection rollers 6 and 7 and separated from the band 5a by means of a separation device 8 and applied to a roller for transfer to the substrate band 1.

The substrate band 1 shown enlarged with reference numeral 10 has a multiplicity of successive RFID straps 11 with pre-determinable spacing, depending on the rotation speed of the roller 9 and the running speed of the substrate band 1 and the spacing of the separated RFID straps on the roller 9.

By means of an optical sensor 12 the spacing of the RFID strap on the roller 9 is measured and for synchronisation compared with the spacing of the antennae to be applied subsequently, the running speed of an antenna web and the spacing of the antennae previously arranged thereon.

As indicated with reference numeral 14, an antenna band 15 is unwound from an unwinding roller 13 and supplied via a deflection roller 16 and further rollers 17, 18 to the substrate band 1, the antennae being either already applied to the antenna band in a preceding time-independent production step or produced in-line as a function of the running speed of the antenna band 15.

The antennae are now mounted on the connection surfaces of the RFID strap in a second step taking place after pre-assembly of the RFID strap on the substrate band 1, such that the connection surfaces of the antennae 20 as shown in the enlarged view come into electrically conductive contact with the connection surfaces of the RFID straps 11.

Now in a system section 21 for production of the electrically conductive connection between the connection surfaces of the straps and antennae, a permanent contact is achieved for example by means of a hot adhesive with pressure application by means of belts 22, 23 and rollers 24.

FIG. 3 shows in diagrammatic cross section view and side view the possible construction of an RFID strap for use in the method according to the invention. This RFID strap is suitable for use in a system to implement the method according to the invention according to a first embodiment of the invention as shown in FIG. 4.

The RFID strap 11 according to FIG. 3 has an electrically isolating substrate band 25 on which are arranged two connection surfaces 26. These electrically conductive connection surfaces are occupied with the RFID chip, the connection surfaces 27 of which are in electrical contact with the connection surfaces 26.

A conductive adhesive band 28 with protective band 29 acting electrically insulating thereon is arranged on the top of the RFID strap.

FIG. 4 shows in diagrammatic side view a system for performance of the method according to the invention in a first embodiment of the invention. The same and equivalent components carry the same reference numerals.

As a substrate band is used an auxiliary carrier band 1a which can be silicon-coated. This auxiliary carrier band which is shown enlarged with reference numeral 10a has a width 15 which is oriented to the requirements for simple processing or further processing.

The auxiliary carrier band is advanced preferably continuously along arrow 31 and carries the RFID straps with a mutual spacing of 11a after passing under the strap assembly and supply device 5.

In a device 32 for the application of adhesive for strap fixing, the adhesive is applied to the auxiliary carrier band 1a for example by means of a dispensing process or a jet process at least locally at the proposed adhesion positions for the straps.

Before application of the individual strap to the auxiliary carrier band 1a, the protective band 29 is removed from the top of the strap 11 and the adhesive 28 applied in layers underneath is activated by means of a heat radiator.

The deposit positions of the straps 11 on the auxiliary carrier band 10a correspond to the spacing of the application positions of the antennae 20 to be mounted later. Thus the pitch of the straps is identical to the pitch of the antennae connection positions. The spacing is synchronised in this regard by means of the optical sensor 12 e.g. a camera.

When in the second step the antennae have been applied to the pre-assembled strap and mounted by means of a device to be electrically conductive and mechanically fixed, the auxiliary carrier band 1a can either be removed again, such as after deflection about a deflection roller 4a, or punched out by means of a die-cutting process not described in more detail here.

The strap supply 33 again takes place with a substrate band or web as shown with the reference numeral 34.

The antenna band 15 is shown in an enlarged view with reference numeral 35. On this antenna band are arranged in two rows the left and right parts of the antennae 20 as for example dipole antennae to be formed for contacting with the left and right connection surfaces of the RFID straps 11. The antennae have a spacing 36.

FIG. 5 shows in a side or cross section view a further possible construction of an RFID strap for its use in a method according to the invention in a second embodiment of the invention as shown in FIG. 6. This structure of the RFID strap has no adhesive layer on the top but an adhesive layer 37 on the underside which is non-conductive. In addition a removable electrically insulating protective band 38 is applied.

FIG. 6 shows in a diagrammatic side view the structure of the system for performance of the method according to the invention according to a second embodiment of the invention. Again the same and equivalent components carry the same reference numerals.

The RFID straps shown diagrammatically in FIG. 5 are applied with their underside on an auxiliary carrier band 1b which can be silicon-coated. For this the adhesive is first applied on the underside of the substrate or substrate band 25 of the RFID straps. Before application of the straps to the auxiliary carrier band 1b the protective band 38 is removed from the straps and the adhesive activated briefly by means of a heat radiator.

The deposit positions of the straps on the auxiliary carrier band 1b correspond to the spacing to be synchronised of the application positions of the antennae to be mounted later as shown in the enlarged view of the substrate 10b.

Again the spacings are synchronised by means of optical sensors.

Now in an intermediate step before application of the antennae 20, a conductive adhesive is applied to the connection surfaces of the RFID straps 11 by means of a device 39. Then in a further step the antennae 20 are applied.

FIG. 7 shows in diagrammatic side view a system for performance of the method according to the invention according to a third embodiment of the invention. Instead of an auxiliary carrier band, a liner 1c, 10c is used which has a self-adhesive surface (for example after removal of a protective band), where this adhesive layer can be applied to a further glued layer. The liner has at least the width 30 of the antenna band to be supplied later. The liner can also be designed self-adhesive so that removal of a protective band is not required.

The RFID straps 11 are glued with their underside to the liner, where before application of the straps not only the protective band of the liner but also the protective band on the top of the RFID straps as shown in FIG. 3 are removed. Now heating of the adhesive layer 28 takes place by means of a heat radiator.

Again the spacing of the straps 11 and the antennae 20 are synchronised for example by means of an optical sensor.

The antennae now, in a second step of the method according to the invention, after an optional conductive adhesive application 42, are connected in a cold lamination process with the strap and liner from above by pressure application by means of a roller laminator 17, 18.

In the connection process an electrically conductive connection then takes place between the antennae and strap connection surfaces (see reference numerals 22, 23 and 24). Here the material composite of liner, strap and antenna web is compressed together under temperature and pressure for a pre-determined time.

In a subsequent rotation die-cutting process in the device 40, the smart labels (antenna and strap) are punched out individually and the remaining material removed and rolled up as a grid 41. The self-adhesive RFID antennae produced by this are supplied to the winder 3.

The RFID straps can either have an adhesive layer at the top as shown in FIG. 3 or a subsequent conductive adhesive layer can be applied as indicated by the reference numeral 42.

All features disclosed in the application documents are claimed as essential to the invention where novel individually or in combination in relation to the prior art.

REFERENCE LIST 1, 10 Substrate web
1a, 1b Auxiliary carrier band
1c Liner
2 Unwinding roller
3 Winding roller
4, 4a Deflection roller
5 Device for supply and application of RFID straps
5a Strap substrate web
6, 7 Deflection roller
8 Strap separation
9 Roller
10a, 10b Auxiliary carrier band
10c Liner
11 RFID straps
11a Spacing
12 Optical sensor
13 Unwinding roller
14 Antenna production or direct antenna supply
15 Antenna band
16 Deflection roller
17, 18 Deflection and pressing rollers
19 Assembly of antennae on RFID straps
20 Antennae 21 Station for production of electrically conductive connection
22, 23, 24 Device for production of an electrically conductive connection
25 Substrate band
26 Connection surfaces
27 Connections
28 Conductive adhesive band
29 Insulating protective band
30 Width of auxiliary carrier band
31 Movement direction of auxiliary carrier band
32 Adhesive application
33 Strap supply
34 Strap substrate band
35 Antenna band
36 Antenna spacing
37 Adhesive layer
38 Electrically insulating protective band
39 Conductive adhesive application
40 Punching device
41 Removal of punched remaining material
42 Conductive adhesive application

The invention claimed is:

1. Method for production of RFID smart labels or smart label inlays in which a multiplicity of RFID straps are joined together in succession with a multiplicity of antennae, the RFID straps having first connection surfaces and the antennae having second connection surfaces wherein in a first step the RFID straps arranged on a strap substrate band are separated and mounted on a substrate band for the smart labels or smart labels inlays to be produced, and in a subsequent second step the antennae are mounted on the substrate band and on the first connection surfaces of the RFID straps such that the first connection surfaces of each RFID strap electrically contact the second connection surfaces of the antennae allocated to the RFID strap, or the first connection surfaces of the RFID straps are positioned and fixed on the second connection surfaces of the antennae for electrically contacting an antenna to each of the RFID straps.

2. Method according to claim 1, wherein the antennae are produced at the same time as the separation and assembly of the RFID strap on the substrate band by arrangement on an antenna band which is then supplied to the substrate band.

3. Method according to claim 1, wherein the antennae before separation and assembly of the RFID strap on the substrate band are produced by arrangement on an antenna band and the antenna band is then supplied to the substrate band.

4. Method according to claim 1, wherein the RFID straps are mounted on the substrate band with a pre-determined spacing to each other.

5. Method according to claim 4, wherein the pre-determined spacing is synchronised with the proposed spacing of the antennae to be applied later.

6. Method according to claim 5, wherein the spacing is synchronised by means of comparison of optical recording data of the RFID strap positions on the substrate band and data of the proposed position of the antennae on the substrate band.

7. Method according to claim 1, wherein the substrate band as an auxiliary carrier substrate band, after assembly of the RFID straps to the antennae, is removed from the resulting smart labels or smart label inlays.

8. Method according to claim 1, wherein the smart labels or smart label inlays produced are self-adhesive and are punched out and can be removed from the substrate band.

9. Method according to claim 1, wherein on a top side of the RFID strap before assembly, an adhesive layer is applied which serves for fixing the antennae to be mounted subsequently.

10. Method according to claim 1, wherein on an underside of the RFID strap before assembly, an adhesive layer is applied for fixing the RFID strap to the substrate band.

11. Method according to claim 1, wherein on the substrate band before assembly of the RFID strap, an adhesive layer is applied at least at points for fixing the RFID strap.

12. Method according to claim 1, wherein the substrate band is self-adhesive.

13. Method according to claim 12, wherein the antennae are laminated to the self-adhesive substrate band under pressure without heat effect.

14. Method according to claim 1, wherein the substrate band is advanced continuously while the method is being carried out.

15. Method according to claim 1, wherein the substrate band and/or the strap substrate band and/or the antenna band is/are advanced discontinuously, preferably in cycles, as the process is being carried out.

16. Method according to claim 1, wherein the strap substrate band is advanced continuously while the method is being carried out.

17. Method according to claim 1, wherein the antenna band is advanced continuously while the method is being carried out.

* * * * *